(12) United States Patent
Kim

(10) Patent No.: US 6,987,791 B2
(45) Date of Patent: Jan. 17, 2006

(54) LONG WAVELENGTH VERTICAL CAVITY SURFACE EMITTING LASERS

(75) Inventor: Jin K. Kim, St. Louis Park, MN (US)

(73) Assignee: Finisar Corporation, Sunnyvale, CA (US)

( * ) Notice: Subject to any disclaimer, the term of this patent is extended or adjusted under 35 U.S.C. 154(b) by 46 days.

(21) Appl. No.: 10/283,298

(22) Filed: Oct. 30, 2002

(65) Prior Publication Data

US 2004/0086016 A1 May 6, 2004

(51) Int. Cl.
*H01S 3/08* (2006.01)

(52) U.S. Cl. .............................. 372/96; 372/45; 372/46
(58) Field of Classification Search .................. 372/45, 372/46, 96
See application file for complete search history.

(56) References Cited

U.S. PATENT DOCUMENTS

| 5,557,626 | A | | 9/1996 | Grodzinski et al. | |
|---|---|---|---|---|---|
| 5,995,531 | A | * | 11/1999 | Gaw et al. | 372/45 |
| 6,185,241 | B1 | * | 2/2001 | Sun | 372/96 |
| 6,534,331 | B2 | * | 3/2003 | Liao et al. | 372/45 |
| 6,577,658 | B1 | * | 6/2003 | Lee et al. | 372/45 |
| 6,618,414 | B1 | | 9/2003 | Wasserbauer et al. | |

* cited by examiner

*Primary Examiner*—Minsun Oh Harvey
*Assistant Examiner*—Cornelius H Jackson
(74) *Attorney, Agent, or Firm*—Workman Nydegger

(57) ABSTRACT

Long-wavelength VCSELs having top DBR mirrors with multiple levels. The individual levels of the DBR are comprised of different materials. The top DBR mirror level(s) forms a pillar structure and/or are defined by trenches. Top contacts are formed on the top DBR mirror below that mirror's top level. An aperture is formed in one of the DBR layers. An ion implanted region is formed in the top DBR and may extend into the active region and into part of a bottom DBR. The top DBRs are beneficially fabricated by etching parts of upper level(s) down to the lower level(s).

32 Claims, 3 Drawing Sheets

LONG WAVELENGTH VERTICAL CAVITY SURFACE EMITTING LASERS

UNITED STATES GOVERNMENT RIGHTS

This invention was made with the United States Government support under 70NAHB8H4023 awarded by National Institute of Science and Technology (NIST). The United Stares Government has certain rights in the invention.

CROSS-REFERENCE TO RELATED APPLICATIONS

Not Applicable.

BACKGROUND OF THE INVENTION

1. Field of the Invention

This invention relates to vertical cavity surface emitting lasers (VCSELs). More specifically, it relates to VCSEL configurations that are particularly suitable for use at long wavelengths.

2. Discussion of the Related Art

VCSELs represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics. In particular, the various material systems can be tailored to produce different laser wavelengths, such as 1550 nm, 1310 nm, 850 nm, 780 nm, 670 nm, and soon.

VCSELs include semiconductor active regions, distributed Bragg reflector (DBR) mirrors, current confinement structures, substrates, and contacts. Because of their complicated structure, and because of their material requirements, VCSELs are usually grown using metal-organic chemical vapor deposition (MOCVD) or molecular beam epitaxy (MBE).

FIG. 1 illustrates a typical VCSEL 10. As shown, an n-doped gallium arsenide (GaAS) substrate 12 has an n-type electrical contact 14. An n-doped lower mirror stack 16 (a DBR) is on the GaAS substrate 12, and an n-type graded-index lower spacer 18 is disposed over the lower mirror stack 16. An active region 20, usually having a number of quantum wells, is formed over the lower spacer 18. A p-type graded-index top spacer 22 (another confinement layer) is disposed over the active region 20, and a p-type top mirror stack 24 (another DBR) is disposed over the top spacer 22. Over the top mirror stack 24 is a p-type conduction layer 9, a p-type GaAS cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined wavelength (or at a multiple thereof). At least part of the top mirror stack 24 includes an insulating region 40 that provides current confinement. The protons can be implanted, for example, in accordance with the teachings of U.S. Pat. No. 5,115,442, which is incorporated by reference. The oxide layer can be formed, for example, in accordance with the teachings of U.S. Pat. No. 5,903,588, which is incorporated by reference. The insulating region 40 is usually formed either by implanting protons into the top mirror stack 24 or by providing an oxide layer. The insulating region 40 defines a conductive annular central opening 42 that forms an electrically conductive path through the insulating region 40.

In operation, an external bias causes an electrical current 21 to flow from the p-type electrical contact 26 toward the n-type electrical contact 14. The insulating region 40 and the conductive central opening 42 confine the current 21 such that the current flows through the conductive central opening 42 to the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the VCSEL 10.

It should be understood that FIG. 1 illustrates a common VCSEL structure, and that numerous variations are possible. For example, the dopings can be changed (say, by providing a p-type substrate 12), different material systems can be used, operational details can be tuned for maximum performance, and additional structures, such as tunnel junctions, can be added. Because of the wide variety of VCSELs that are possible it is convenient to categorize VCSELs so that useful comparisons can be made. Typical categorizes include substrate material, output geometry (top-emitting or bottom-emitting), current isolation method, and electric contact configurations.

The substrate material that is used effectively controls the bottom DBR and the active region 20. This is because the bottom DBR must be well lattice-matched to the substrate since the active region, which must lattice match with the bottom DBR, cannot tolerate defects caused by a large lattice-mismatching. Commonly used substrate-DBR configurations include GaAs substrates with AlGaAs and/or AlGaInP; InP substrates with AlGaAsSb, with AlGaInAs, with InGaAsP, and/or AlGaPSb; and InAs/GaSb substrates with AlGaAsSb, and/or AlGaSbP.

Top-emitting VCSELs (in which light is emitted through a top DBR) have the advantage of being compatible with standardized 850 VCSEL packages, but the disadvantages of being less compatible with dielectric, oxide, metamorphic and metal-assisted DBRs. Bottom-emitting VCSELs (in which light is emitted through a bottom DBR) have the advantages of being compatible with a wide range of top DBR materials and being compatible with co-planar transmission lines, but the disadvantage of being less compatible with current 850 nm VCSEL packaging.

Methods of providing current isolation include ion-implantation and oxide aperture structures, including pillars, holes, and trenches. Ion-implanted VCSELs have demonstrated greater reliability than those that use oxide apertures. However, oxide-apertured VCSELs have advantages of higher speed and higher efficiency. Both schemes are suitable for long-wavelength VCSELs.

Various anode and cathode electrical contacting schemes are possible with VCSELs. Placing electrical contacts on opposite sides of the substrate reduces manufacturing difficulty. However, having all electrical contacts on the same side of the substrate can reduce device capacitance, and thus improve high-speed characteristics. Also, having both electrical contacts on the same side of the substrate enables the use of an insulative DBR on the opposite side of the substrate. Such an insulative DBR does not require doping, which enables DBR compositions with bandgaps close to the emission wavelength. This can boost reflectivity.

While generally successful, VCSELs have problems. In particular, VCSELs used at long wavelengths, such as 1550 nm or 1310 nm, are currently significantly less than optimal. This is a problem because long-wavelength VCSELs (1.2 $\mu$m–1.7 $\mu$m) are needed for future generation data communication and telecommunication applications. Therefore, novel VCSEL structures suitable for use in long-wavelength applications would be beneficial.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to novel VCSELs that are suitable for use at long-wavelengths. Beneficially, such VCSELs are readily implemented using common fabrication technology.

A first VCSEL according to the principles of the present invention is a top emitting VCSEL comprised of a substrate having top and bottom electrical contacts. A bottom DBR (made from stacked material layers having different indexes of refraction) is over a substrate. An active region is disposed over the bottom DBR, and a top DBR is disposed over the active region. The top DBR is comprised of a first level, beneficially of InGaAsP/InP or of AlGaInAs, and of second level, beneficially of AlGaAs, of AlGaAsSb, or of an oxidized material. The second level extends over part of the first level. Top electrical contacts are on the first level, while the second level may include an oxide aperture. While that oxide aperture can be an oxidized layer, an air gap is also possible. The first level may include an ion-implanted region that may extend into the active region and into part of the bottom DBR. Such a VCSEL combines benefits of ion-implant current/carrier aperturing with an oxide aperture. Beneficially, the top DBR is fabricated by forming the first level and the second level, then etching part of the second level down to the first level using dry etching (such as by using a chlorine plasma). This is particularly beneficial when the first level act as an etch stop.

A second VCSEL according to the principles of the present invention is a top emitting VCSEL comprised of a substrate having top and bottom electrical contacts. A bottom DBR is over the substrate. An active region is disposed over the bottom DBR, and a top DBR is disposed over the active region. The top DBR is comprised of a first level, beneficially of InGaAsP/InP or of AlGaInAs, a second level, beneficially of InGaAsP/InP or of AlGaInAs, that extends over part of the first level, and a third level, beneficially of AlGaAs, of AlGaAsSb, or of an oxidized material that extends over part of the second level. Top contacts are provided on the second level, which may also include an oxide aperture. While that oxide aperture can be an oxidized layer, an air gap is also possible. The first level may include an ion-implanted region that may extend into the active region and into part of the bottom DBR. Such a VCSEL combines benefits of ion-implant current/carrier aperturing with an oxide aperture. Beneficially, the top DBR is fabricated by forming the first level, the second level, and the third level, and by etching part of the third level down to the second level, and part of the second level down to the first level. The third level can be etched using chlorine plasma, while the second level may be etched using methane/hydrogen/argon plasma or other selective etches. This is preferred over non-selective etches.

A third VCSEL according to the principles of the present invention is a top emitting VCSEL having all electrical contacts above a substrate. A bottom DBR is over the substrate, and an active region extends over part of the bottom DBR. Bottom contacts are formed on the bottom DBR and adjacent the active region. A top DBR is disposed over the active region. The top DBR is comprised of a first level, beneficially of InGaAsP/InP or of AlGaInAs, and a second level, beneficially of AlGaAs, of AlGaAsSb, or of an oxidized material. The second level extends over part of the first level. Top contacts are provided on the first level. The first level may further include an oxide aperture. While that oxide aperture can be an oxidized layer, an air gap is also possible. Beneficially, the top DBR is fabricated by forming an active layer, a layer for the first level, and a layer for the second level. Then, the layer for the second level is etched down to the layer for the first level. Then, part of the layer for the first level and part of the active layer are etched down to the bottom DBR.

Additional features and advantages of the invention will be set forth in the description that follows, and in part will be apparent from that description, or may be learned by practice of the invention.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

Figure 1:
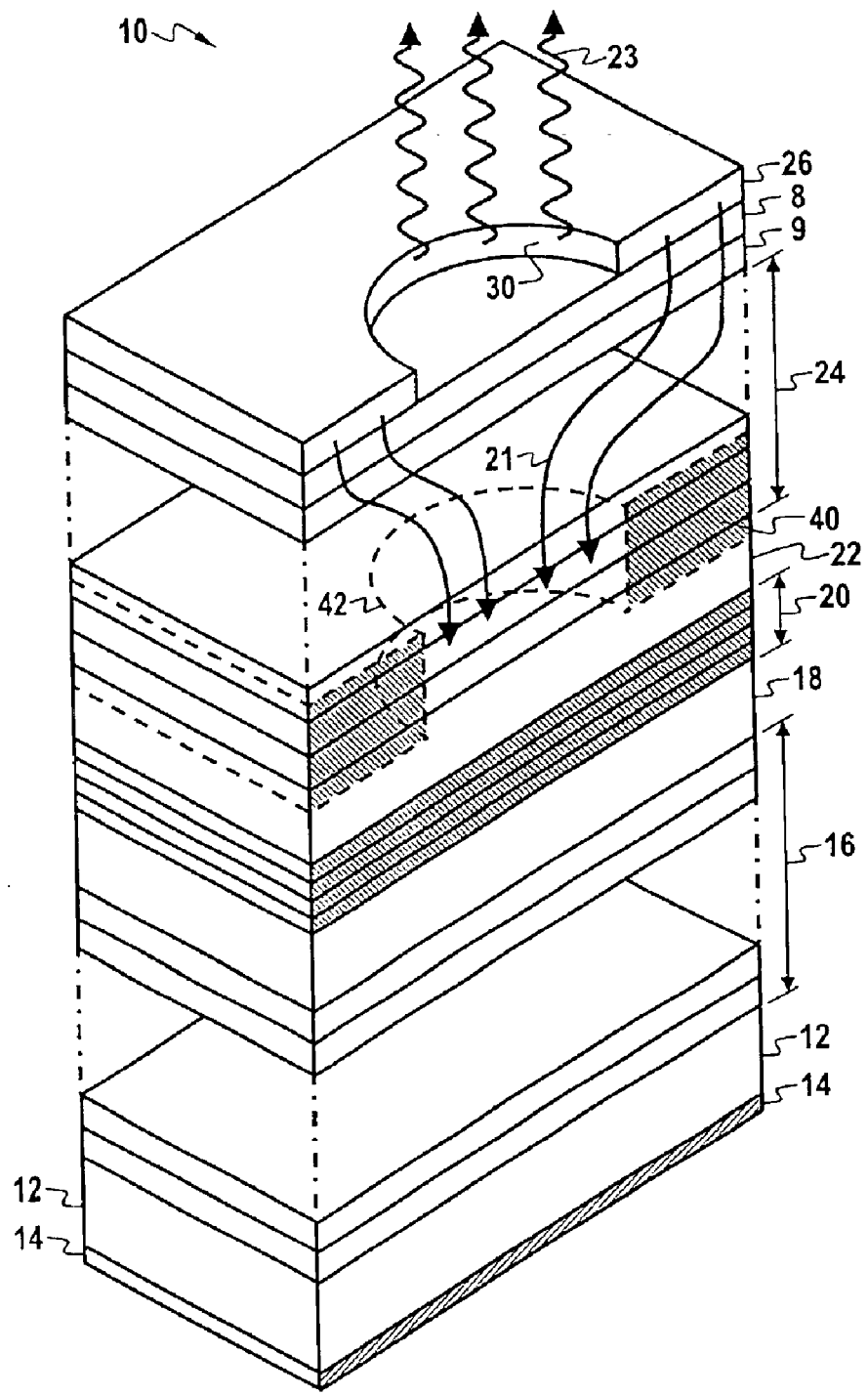
FIG. 1 illustrates a typical prior art VCSEL.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to an embodiment of the present invention, example of which is illustrated in the accompanying drawings.

The principles of the present invention provide for novel VCSELs that are suitable for use at long-wavelengths. Such VCSELs include top DBRs that are comprised of stacked levels.

Figure 2:
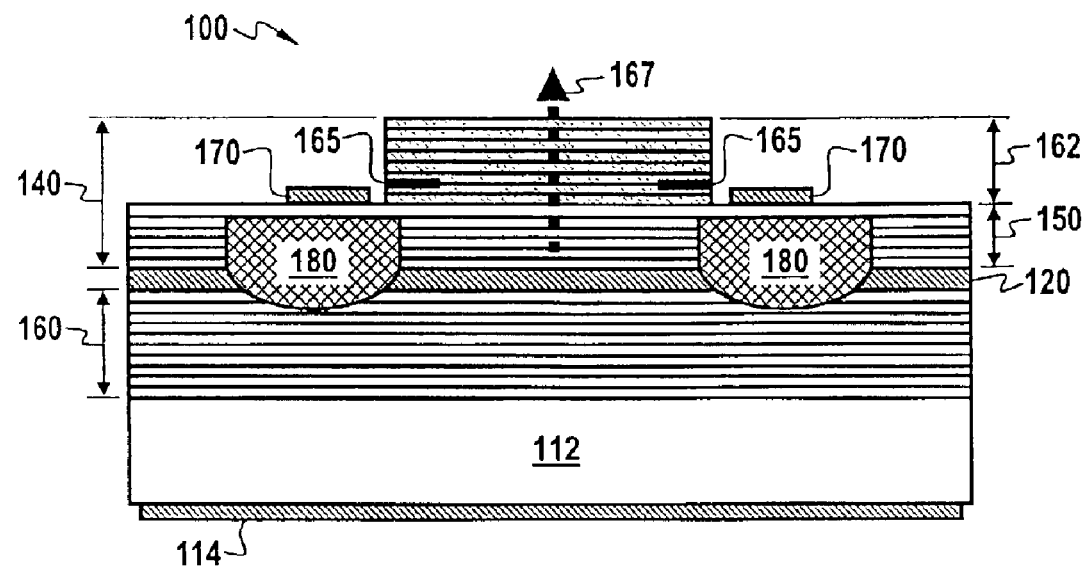
FIG. 2 illustrates a VCSEL that is in accord with the principles of the present invention.

Refer now to FIG. 2 for an illustration of a VCSEL 100 that is in accord with the principles of the present invention. FIG. 2 should be understood as a simplified "cut-away" schematic depiction of a VCSEL that is generally configured as shown in FIG. 1. However, the VCSEL 100 includes novel features that render it particularly suitable for long wavelength applications.

As shown in FIG. 2, the VCSEL 100 includes an n-doped substrate 112 having an n-type electrical contact 114. Suitable substrate materials include GaAs, InP, and InAs/GaSb. An n-doped lower mirror stack 160 (a DBR) is over the substrate 112. That lower mirror stack 160 optionally includes an n-type graded-index lower spacer. For high reflectivity and high thermal conductivity the lower mirror stack 160 is beneficially comprised of AlGaAsSb/InP or AlGaPSb/InP. Alternatively, for ease of implementation the lower mirror stack 160 is beneficially comprised of InGaAsP/InP or AlGaInAs/InP.

Still referring to FIG. 2, over the lower mirror stack 160 is an active region 120 having P-N junction structures with a number of quantum wells. The composition of the active region 120 is beneficially AlGaInAs, with the specific aluminum, gallium, and indium content varying in the different layers that form the active region 120. There could be many alternating layers, depending how the quantum wells are to be in the active region 120.

Over the active region 120 is a tiered p-type top mirror stack 140 (another DBR). The top mirror stack optionally includes a top spacer. In any event, the lower mirror stack 160 is separated from the top mirror stack 140 such that an optical cavity that is resonant at a specific wavelength is formed.

Still referring to FIG. 2, the tiered top mirror stack 140 is comprised of two levels that have significantly different etching characteristics. For example, the first level 150 may be comprised of a combination of AlGaInAs, AlInAs, InGaAsP, and InP while the second may be comprised of AlGaAs, AlGaAsSb, AlGaPSb, or an oxidized material. The second level 162 extends over part of the first level 150. Top electrical contacts 170 are formed on the first level 150. The second level 162 may include an oxide structure 165 that forms a light aperture. While the aperture 165 can be comprised of an oxidized layer, an air gap is also suitable.

The VCSEL 100 may also include an ion-implanted region 180 that may extend from the first level 150 through the active region 120 and into the bottom DBR 160. The ion-implanted region 180 confines current through a desired region of the active region 120 of the VCSEL 100. Furthermore, if the VCSEL 100 is part of a VCSEL array, the ion-implanted region 180 assists isolating the individual VCSELs 100 of that array. The VCSEL 100 combines benefits of ion-implant isolation with an oxide aperture.

The embodiment illustrated in FIG. 2 is beneficial because it allows for easy plasma etching of the top level 162 so that ion implanting can be performed to adequate depths with commonly available implant equipment. A (chlorine) plasma dry etch at room temperature stops on the lower level 150 with great selectivity. The oxide structure 165 can be easily implemented in top layer 162. Furthermore, the lateral position of the ion-implanted region 180 can be controlled by angled implanting. The relative sizes of the aperture created by the oxide structure 165 and the ion-implanted region 180 determine some of the device characteristics, and thus, should be optimized for a particular application. In response to current flow through the active region 120, laser light 167 is emitted from the top surface of the VCSEL 100. Mirror configurations may be trivially altered to induce bottom emission instead.

It should be noted that the second level of the DBR is above the electrical contacts 170. Therefore, it is possible to form the second level from dielectric materials, such as $SiN_x$ and $SiO_x$, or from a combination of dielectric and semiconductor materials, like Si and $AlO_x$. However, semiconductor materials that can be epitaxially grown are preferred. Another possibility is a semiconductor partial DBR that oxidizes to produce the desired characteristics: an example is the AlGaAs/GaAs pair.

Figure 3:
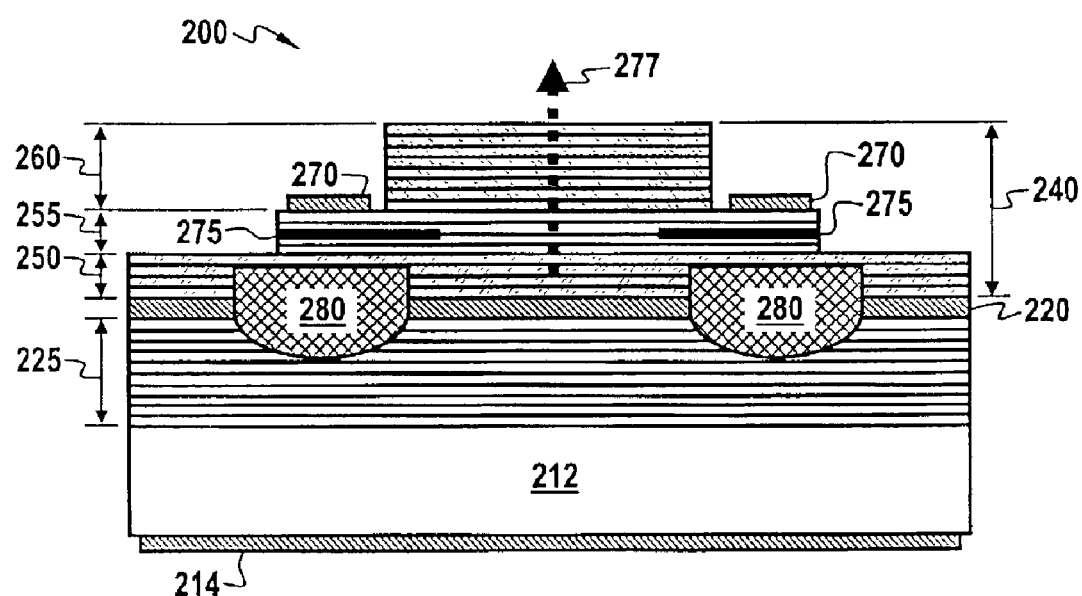
FIG. 3 illustrates another VCSEL that is in accord with the principles of the present invention.

A variation of the embodiment illustrated in FIG. 2 would be to implement the oxide aperture below the top contact. This would enable greater freedom in the relative sizes of the oxide structure (or air aperture) and the ion-implanted region. Such an embodiment is illustrated in FIG. 3. That figure shows a VCSEL 200 that is in accord with the principles of the present invention. FIG. 3 should be understood as a simplified "cut-away" schematic depiction of a VCSEL that is generally configured as shown in FIG. 1. However, the VCSEL 200 includes novel features that render it particularly suitable for long wavelength applications.

As shown in FIG. 3, the VCSEL 200 includes an n-doped substrate 212 having an n-type electrical contact 214. Suitable substrate materials include GaAs, InP, and InAs/GaSb. An n-doped lower mirror stack 225 (a DBR) is over the substrate 212. That lower mirror stack 225 optionally includes an n-type graded-index lower spacer. For high reflectivity and high thermal conductivity the lower mirror stack 225 is beneficially AlGaAsSb/InP or AlGaPSb/InP. Alternatively, for ease of implementation the lower mirror stack is beneficially InGaAsP/InP or AlGaInAs/InP.

Still referring to FIG. 3, over the lower mirror stack 225 is an active region 220 having P-N junction structures with a number of quantum wells. The composition of the active region 220 is beneficially AlGaInAs, with the specific aluminum, gallium, and indium contents varying in the different layers that form the active region 220. Reference the earlier discussion regarding the active region 120.

Over the active region 220 is a tiered p-type top mirror stack 240 (another DBR). The top mirror stack 240 optionally includes a top spacer. In any event, the lower mirror stack 225 is separated from the top mirror stack 240 such that an optical cavity that is resonant at a specific wavelength is formed.

Still referring to FIG. 3, the tiered top mirror stack 240 is comprised of three levels. A first level 250 is beneficially InGaAsP/InP or AlGaInAs/AlInAs, a second level 255 is beneficially InGaAsP/InP or AlGaInAs/AlInAs, and a third level 260 is beneficially AlGaAs, AlGaAsSb, or an oxidized material. The first level 250 extends over the active region 220, the second level 255 extends over part of the first level 250, and the third level 260 extends over part of the second level 255.

Top contacts 270 are formed on the second level 255. The second level 255 may include an oxide structure 275 that forms an optical aperture. While the aperture 275 can be comprised of an oxidized layer, an air gap is also suitable.

The VCSEL 200 may also include an ion-implanted region 280 in the first level 250 that may extend through the active region 220 and into the bottom DBR 225. The ion-implanted region 280 confines current through a desired region of the active region 220. Furthermore, if the VCSEL 200 is part of a VCSEL array, the ion-implanted region 280 assists isolating the individual VCSELs 200 of that array. The VCSEL 200 combines the benefits of ion implant isolation with an oxide aperture. When a current flows between the electrical contacts 214 and 270, laser light 277 is emitted from a top surface of the VCSEL 200. Mirror configurations may be trivially altered to induce bottom emission instead.

Beneficially, the VCSEL 200 is fabricated using standard fabrication techniques until the top mirror stack 240 is being formed. Then, a top mirror stack comprised of a first layer of InGaAsP/InP or AlGaInAs/AlInAs, a second layer of InGaAsP/InP or AlGaInAs/AlInAs, and a third layer of AlGaAs, AlGaAsSb, or of an oxidized material is formed. Then, then part of the third level is dry etched down to the second level, beneficially using chlorine plasma. Then, part of the second level is dry etched down to the first level, beneficially using methane/hydrogen/argon plasma or other selective etches. This is preferred over non-selective etches. Oxidation (or another etch) can then produce the oxide structure 275. The ion-implanted region 280 is beneficially fabricated by driving ions into the first level 250 at an angle using ion implant equipment. The driven ions produce structural damage that creates a high resistance area that act to confine current and/or carriers into the active region 220.

The VCSEL 200 of FIG. 3 significantly differs from the VCSEL 100 of FIG. 2 by the use of a three level top mirror stack 240, by its particular tiered structure, and by the location of the oxide structure 275 and its relationship to the position of the contacts 270. AlGaAs or AlGaAsSb produce high refractive index contrasts, and thus short photon penetration. This reduces photon lifetimes and enhances high-speed device characteristics. Oxidizing the DBR increases this effect. Because the electrical contacts 270 are made on one of the lower partial DBRs, the partial DBR(s) above the electrical contacts need not be conducting. This lifts the constraints of low voltage drops through the non-conducting partial DBRs, which allows the use of abrupt DBR interfaces and materials of poor electrical conductivity, such as "metamorphic" AlGaAs/GaAs DBR(s) on InP. The pillars formed by the upper partial DBRs can be made the only protruding features, thus maintaining much of the desirability of a planar process.

Figure 4:
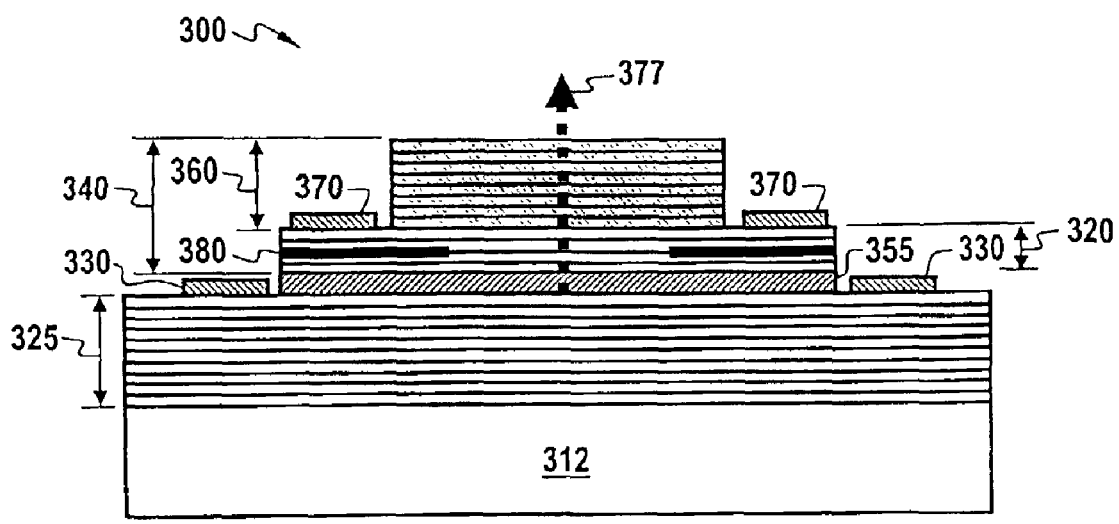
FIG. 4 illustrates yet another VCSEL that is in accord with the principles of the present invention.

Another useful variation would be to move the bottom electrical contact to the same side of the substrate as the top contact. This would enable the use of an undoped bottom DBR. FIG. 4 illustrates such a VCSEL 300, which should be understood as a simplified "cut-away" schematic depiction of a VCSEL that is generally configured as shown in FIG. 1. However, the VCSEL 300 includes novel features that render it particularly suitable for long wavelength applications.

As shown in FIG. 4, the VCSEL 300 includes an n-doped substrate 312. Suitable substrate materials include GaAs, InP, and InAs/GaSb. An n-doped lower mirror stack 325 (a DBR) is over the substrate 312. That lower mirror stack 325 optionally includes an n-type graded-index lower spacer. For high reflectivity and high thermal conductivity the lower mirror stack 325 is beneficially comprised of AlGaAsSb/InP or AlGaPSb/InP. Alternatively, for ease of implementation the lower mirror stack is comprised of InGaAsP/InP or AlGaInAs/InP.

Still referring to FIG. 4, over the lower mirror stack 325 is an active region 355 and bottom electrical contacts 330. The active region 355 includes P-N junction structures with a number of quantum wells. The composition of the active region 355 is beneficially AlGaInAs, with the specific aluminum, gallium, and indium contents varying in the different layers that form the active region 355. Reference the earlier discussion regarding the active region 120.

Over the active region 355 is a two-tiered p-type top mirror stack 340 (another DBR). The top mirror stack 340 optionally includes a top spacer. In any event, the lower mirror stack 325 is separated from the top mirror stack 340 such that an optical cavity that is resonant at a specific wavelength is formed.

Still referring to FIG. 4, the top mirror stack 340 has a first level 320 that is beneficially comprised of InGaAsP/InP or of AlGaInAs/InP, and a second level 360 that is beneficially comprised of AlGaAs, of AlGaAsSb, or of an oxidized material. The first level 320 extends over the active region 355, while the second level 360 extends over part of the first level 320. Top contacts 370 are formed on the first level 320. The first level 320 may include an oxide structure 380 that forms an aperture. While the aperture can be comprised of an oxidized layer, an air gap is also suitable. In either event, the oxide containing structure 380 confines current flow from the top contacts 370 to the bottom contacts 330 such that the current flows through a desired portion of the active region 355. In response to the current light 377 is emitted from the top surface of the VCSEL 300. Mirror configurations may be trivially altered to induce bottom emission instead.

Beneficially, the VCSEL 300 is fabricated using standard fabrication techniques until the top mirror stack 340 is being formed. Then, a top mirror stack comprised of a first layer of InGaAsP/InP or of AlGaInAs/AlInAs and a second layer of AlGaAs, of AlGaAsSb, or of an oxidized material is formed. Then, part of the second layer is etched down to the first level, beneficially using chlorine plasma or other selective etches. This is preferred over non-selective etches. Oxidation (or another etch) can then produce the oxide structure 380.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A Vertical Cavity Surface Emitting Laser, comprising:
   a substrate having a bottom contact;
   an active region over said substrate, said active region for emitting light at a predetermined wavelength in response to an applied electric current;
   a bottom distributed Bragg reflector mirror disposed between said active region and said substrate, said bottom distributed Bragg reflector mirror for reflecting light emitted by said active region back toward said active region;
   a top distributed Bragg reflector mirror adjacent said active region, said top distributed Bragg reflector mirror for reflecting light emitted by said active region back toward said active region; wherein said top distributed Bragg reflector mirror has a first level and a second level that partially extends over, and is adjacent to, the first level;
   a top contact adjacent to said first level with no intervening layers; and
   an ion implanted region in said first level.

2. A Vertical Cavity Surface Emitting Laser according to claim 1, wherein materials comprising said first level and said second level have different etching characteristics.

3. A Vertical Cavity Surface Emitting Laser according to claim 1, wherein said first level is comprised of a material selected from the group consisting of AlGaInAs, AlInAs, InGaAsP, and InP, and combinations thereof.

4. A Vertical Cavity Surface Emitting Laser according to claim 1, wherein said second level is made of a material selected from the group consisting of AlGaAs, AlGaAsSb, AlGaPSb, an oxidized material, and combinations thereof.

5. A Vertical Cavity Surface Emitting Laser according to claim 1, wherein said ion implanted region extends into said active region.

6. A Vertical Cavity Surface Emitting Laser according to claim 1, wherein said ion implanted region extends into part of said bottom distributed Bragg reflector mirror.

7. A Vertical Cavity Surface Emitting Laser according to claim 1, wherein said second level includes an aperture.

8. A Vertical Cavity Surface Emitting Laser according to claim 7, wherein said second aperture is an oxidized layer.

9. A Vertical Cavity Surface Emitting Laser according to claim 7, wherein said aperture is an air gap.

10. A Vertical Cavity Surface Emitting Laser, comprising:
    a substrate having a bottom context;
    an active region over said substrate, said active region for emitting light at a predetermined wavelength in response to an applied electric current;
    a bottom distributed Bragg reflector mirror disposed between said active region and said substrate, said bottom distributed Bragg reflector mirror for reflecting light emitted by said active region back toward said active region;
    a top distributed Bragg reflector mirror adjacent said active region, said top distributed Bragg reflector mirror for reflecting light emitted by said active region back toward said active region; wherein said top distributed Bragg reflector mirror has a first level, a second level that partially extends over the first level, a third level that extends over a part of said second level, an aperture over said first level, and top contact over said first level; and
    an ion implanted region below said top contact.

11. A Vertical Cavity Surface Emitting Laser according to claim 10, wherein said first and second levels are comprised of materials that have different etching characteristics.

12. A Vertical Cavity Surface Emitting Laser according to claim 10, wherein said second and third levels of the top distributed Bragg reflector are comprised of materials that have different etching characteristics.

13. A Vertical Cavity Surface Emitting Laser according to claim 10, wherein said first level is comprised of a material selected from the group consisting of lnGaAsP/InP and AlGaInAs/AlInAs, and combinations thereof.

14. A Vertical Cavity Surface Emitting Laser according to claim 10, wherein said second level is comprised of a material selected from the group consisting of AlGaInAs/AlInAS and InGaAsP/InP, and combinations thereof.

15. A Vertical Cavity Surface Emitting Laser according to claim 10, wherein said third level is comprised of a material selected from the group consisting of AIGaAs, AlGaAsSb, AlGaPSb, an oxidized material, and combinations thereof.

16. A Vertical Cavity Surface Emitting Laser according to claim 10, wherein said aperture is an oxidized layer.

17. A Vertical Cavity Surface Emitting Laser according to claim 10, wherein said aperture is an air gap.

18. A Vertical cavity Surface Emitting Laser according to claim 10, wherein said ion implanted region extends into said first level.

19. A Vertical Cavity Surface Emitting Law according to claim 10, wherein said ion implanted region extends into said second level.

20. A Vertical Cavity Surface Emitting Laser, comprising:
    a substrate;
    a bottom distributed Bragg reflector mirror over said substrate, said bottom distributed Bragg reflective mirror for reflecting light;
    an active region extending over part of said bottom distributed Bragg reflector mirror, said active region for emitting light at a predetermined wavelength in response to an electric current;
    a bottom contact adjacent to said bottom distributed Bragg reflector mirror with no intervening layers;
    a top distributed Bragg reflector mirror adjacent said active region, said top distributed Bragg reflector mirror for reflecting light emitted by said active region back toward said active region; wherein said top distributed Bragg reflector mirror has a first level and a second level that extends over part of the first level and an aperture;
    a top contact on said first level.

21. A Vertical Cavity Surface Emitting Laser according to claim 20, wherein said first and second levels are comprised of materials that have different etching characteristics.

22. A Vertical Cavity Surface Emitting Laser according to claim 20, wherein said first level includes a material selected from the group consisting of AlGaInAs, AlInAs, InGaAsP, and InP, and combinations thereof.

23. A Vertical Cavity Surface Emitting Laser according to claim 20, wherein said second level is comprised of a material selected from the group consisting of AlGaAS, AlGaAsSb, AlGaPSb, an oxidized material, and combinations thereof.

24. A Vertical Cavity Surface Emitting Laser according to claim 20, wherein said aperture is an oxidized layer.

25. A Vertical Cavity Surface Emitting Laser according to claim 20, wherein said aperture is an air gap.

26. A Vertical Cavity Surface Emitting Laser comprising:
    an active region, said active region emitting light at a predetermined wavelength in response to an applied electric current;
    a bottom distributed Bragg reflector mirror adjacent to said active region, said bottom distributed Bragg reflector mirror reflecting light emitted by said active region back toward said active region;
    a top distributed Bragg reflector mirror adjacent to said active region, said top distributed Bragg reflector mirror reflecting light emitted by said active region back toward said active region, wherein said top distributed Bragg reflector mirror includes a first level adjacent said active region, a second level partially extending over, and adjacent to, said first level, and an aperture over said first level;
    a top contact over said first level; and
    an ion implanted region below said top contact.

27. A Vertical Cavity Surface Emitting Laser according to claim 26, wherein said top contact directly contacts said first level.

28. A Vertical Cavity Surface Emitting Laser according to claim 26, wherein said top contact directly contacts said second level.

29. A Vertical Cavity Surfacc Emitting Laser according to claim 26, wherein said top distributed Bragg reflector mirror further includes a third level extending over part of, and adjacent to, said second level.

30. A Vertical Cavity Surface Emitting Laser according to claim 26, further including a bottom contact directly contacting said bottom distributed Bragg reflector mirror.

31. A Vertical Cavity Surface Emitting Laser according to claim 26, further including a substrate adjacent said bottom distributed Bragg reflector mirror.

32. A Vertical Cavity Surface Emitting Laser according to claim 31, further including a bottom contact separated from said bottom distributed Bragg reflector mirror by said substrate.

* * * * *

UNITED STATES PATENT AND TRADEMARK OFFICE
CERTIFICATE OF CORRECTION

PATENT NO.        : 6,987,791 B2
APPLICATION NO. : 10/283298
DATED             : January 17, 2006
INVENTOR(S)      : Jin K. Kim It is certified that error appears in the above-identified patent and that said Letters Patent is hereby corrected as shown below:

Column 1
Line 29, change "soon" to --so on--
Line 37, change "(GaAS)" to --(GaAs)--
Line 39, change "GaAS" to --GaAs--
Line 47, change "GaAS" to --GaAs--

Column 2
Line 23, change "categorizes" to --categories--

Column 3
Line 35, change "act" to --acts--

Column 6
Line 64, after "Then," remove [then]

Column 7
Line 6, change "act" to --acts--
Line 58, change "AlGalnAs/InP" to --AlGaInAs/InP--
Line 59, change "AIGaAsSb" to --AlGaAsSb--

Column 8
Line 2, before "current light" change "the" to --that,--

Column 9
Line 39, change "lnGaAsP/InP" to --InGaAsP/InP--
Line 43, change "AIGaInAs/" to --AlGaInAs/--
Line 47, change "AIGaAs" to --AlGaAs--
Line 55, change "Law" to --Laser--

UNITED STATES PATENT AND TRADEMARK OFFICE
CERTIFICATE OF CORRECTION

PATENT NO. : 6,987,791 B2
APPLICATION NO. : 10/283298
DATED : January 17, 2006
INVENTOR(S) : Jin K. Kim It is certified that error appears in the above-identified patent and that said Letters Patent is hereby corrected as shown below:

Column 10
Line 21, change "AlGaAS" to --AlGaAs--

Signed and Sealed this

Eighteenth Day of March, 2008

JON W. DUDAS
*Director of the United States Patent and Trademark Office*